United States Patent [19]

Shipkowski

[11] Patent Number: 4,929,932
[45] Date of Patent: May 29, 1990

[54] SOLID STATE RELAY HAVING VISUAL CONTACT MONITOR

[75] Inventor: James P. Shipkowski, Rochester, N.Y.

[73] Assignee: Eastman Kodak Company, Rochester, N.Y.

[21] Appl. No.: 342,772

[22] Filed: Apr. 24, 1989

[51] Int. Cl.$^5$ ............................................. G08B 21/00
[52] U.S. Cl. ...................... 340/644; 340/645; 340/653; 340/654; 324/418; 361/97; 307/112; 307/139
[58] Field of Search ............... 340/644, 645, 653, 654; 324/418, 537, 435, 433, 133; 323/282; 361/97; 307/112, 132 E, 140, 139

[56] References Cited

U.S. PATENT DOCUMENTS

| | | | |
|---|---|---|---|
| 3,346,855 | 10/1967 | Bishop | 324/418 |
| 3,696,364 | 10/1972 | Lavelle | 340/252 R |
| 4,099,100 | 7/1978 | Takahata | 340/653 |
| 4,340,852 | 7/1982 | Togneri | 340/644 |
| 4,479,117 | 10/1984 | Marquardt | 340/644 |

FOREIGN PATENT DOCUMENTS 2162391 1/1986 United Kingdom ................ 340/644

*Primary Examiner*—Joseph A. Orsino
*Assistant Examiner*—Kinfe-Michael Negash
*Attorney, Agent, or Firm*—J. R. Hanway

[57] ABSTRACT

A visual indication system for easily providing information about the status of the output terminals of a solid state relay. A two-electrode neon glow lamp is connected across the output terminals of the relay in series with a current limiting resistor. The shunting impedance of the relay output terminals prevents voltage from inducing a glow in the neon lamp in certain modes of terminal configuration. When the terminals are ON, neither electrode glows. When the terminals are OFF, both electrodes glow. If the AC relay fails in a half-wave mode, only one of the electrodes will glow.

8 Claims, 2 Drawing Sheets

| CONTACTS | GLOWING ELECTRODES |
|---|---|
| OFF | BOTH |
| ON | NONE |
| HALF-WAVE | ONE |

SOLID STATE RELAY HAVING VISUAL CONTACT MONITOR

BACKGROUND OF THE INVENTION

1. Field of the Invention

This invention relates, in general, to electrical relays and, more specifically, to relays with state indicators.

2. Description of the Prior Art

Relays are used in a wide variety of devices, many of which must be serviced in the field. Trouble shooting of such devices is especially difficult when solid state relays are used in place of conventional electromechanical relays. The difficulty lies in the fact that, with solid state relays, the state or condition of the relay contacts cannot visually be seen by the technician. In other words, when a relay is inspected to see if it is energized, it is not readily apparent from a visual inspection that the "contacts" in the relay are in the proper position.

In addition to the problem of not being able to see any physical contacts in a solid state relay, there are also other difficulties associated with solid state relays which make trouble shooting difficult. With solid state relays, a failure of the relay can occur in three different modes, assuming that the relay is designed and constructed to normally switch alternating current (AC) loads. In one mode, the contacts, or circuit path, fails to close when the relay is energized. In another mode, the contacts can be shorted together and fail to open when the relay is de-energized. A third mode of failure occurs when the solid state components of the relay partially fail and produce a half-wave current conducting path. Since solid state relays capable of switching AC current usually contain at least one thyristor, the half-wave failure occurs when the thyristor incurs polarity sensitive damage such that it conducts current in one direction all of the time, regardless of control signals or the load current waveform. This type of failure is difficult to diagnose conclusively with simple current or voltage measurements using the common electrical multimeter or similar devices. Lacking more sophisticated instrumentation, such as an oscilloscope, the technician often replaces many relays unnecessarily.

Conventional relay monitoring and indicating devices, especially for electromechanical relays, usually indicate the status of the control circuit which is connected to energize or de-energize the relay. In the simplest form, this could consist of an incandescent lamp connected in parallel with the relay coil. Such an indicator does not provide any information about the polarity of a failure nor does it indicate the state of the relay contacts. Other types of indicators combine the energization circuit of the relay with the load circuit connected to the relay contacts to provide other information about the operation of the relay.

U.S. Pat. No. 4,479,117, issued on Oct. 23, 1984, discloses such an arrangement where the visual indicator is responsive to both the energization circuit and the status of the relay contacts. In effect, the state indicator system for the relay in this patent includes a lamp which lights when the contacts are energized properly upon the application of an energizing voltage, and a second lamp which lights to indicate a fault when the contacts do not close when the coil is energized. Although the indicators shown in the referenced patent may be useful in some applications, they are not capable of indicating any polarity failure of the relay contacts nor the condition of the relay contacts irrespective of the control voltage applied to the coil of the relay.

Therefore, it is desirable, and it is an object of this invention, to provide relay apparatus which economically provides a visual indication of the effective contact position of a solid state relay irrespective of the control voltage applied to operate the relay. In addition, it is also desirable, and it is another object of this invention, to provide an indication of a partial failure in the switching elements of the solid state relay, and a polarity associated with the failure.

SUMMARY OF THE INVENTION

There is disclosed herein new, useful, and very economical apparatus for providing a visual indication about the status of the output terminals of a solid state relay. In the preferred embodiment of the invention, a two-electrode neon glow lamp is connected through a current limiting resistor across the output terminals of a thyristor-controlled solid state relay device. The output terminals are also connected to the load circuitry which would normally contain a load impedance and a source of AC power. By observing the glow of the neon gas adjacent to the two electrodes of the lamp, the condition of the output terminals of the solid state relay can be determined. By this determination, it can be decided whether the relay is functioning properly or is functioning improperly. In some cases, the polarity of a failure or malfunction can be determined by observing the electrodes in the neon glow lamp.

The neon glow lamp represents the state or mode of the relay contacts irrespective of the status of the control signal applied to the relay. When the contacts of the relay are open, or in the OFF mode, both of the electrodes of the neon lamp will appear to glow due to the voltage impressed across the indicating circuit branch containing the neon glow lamp. However, when the contacts of the relay are in the ON condition, the indicating circuit branch containing the neon lamp is shunted by the output terminals and sufficient voltage to cause the electrodes in the glow lamp to glow is not developed. A third condition, usually caused by a partial failure of a thyristor in the solid state relay, causes only one of the electrodes of the neon lamp to glow. This occurs when the solid state components of the relay have failed in a manner which provides conduction of current in only one direction between the output terminals. Thus, the shunting effect of the output terminals only exist during one-half of the cycle of the alternating current. During the other half of the cycle, sufficient voltage exists across the neon lamp to cause the negative electrode of the lamp to glow.

By using the information provided by the visual indication of the neon glow lamp, the status of the relay contacts can be economically and easily determined. This is advantageous in trouble shooting apparatus containing solid state relays in that it aids the technician in locating the relays which are functioning properly or which are malfunctioning for various reasons. In the event of a malfunction, some information about the type of malfunction can also be obtained by observing the pattern of glow in the neon lamp.

BRIEF DESCRIPTION OF THE DRAWINGS

Further advantages and uses of this invention will become more apparent when considered in view of the following detailed description and drawings, in which.

DESCRIPTION OF THE PREFERRED EMBODIMENTS

Figure 1:
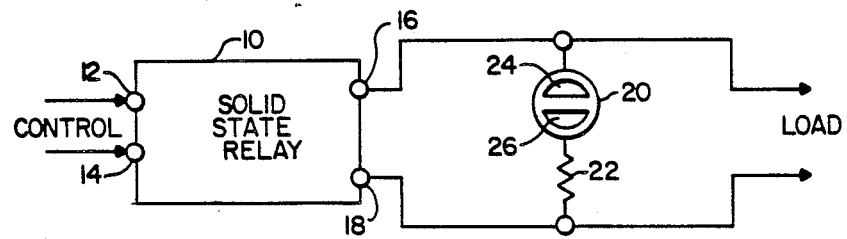
FIG. 1 is a schematic diagram of solid state relay apparatus constructed according to this invention.

Throughout the following description, similar reference characters refer to similar elements or members in all of the figures of the drawings.

Referring now to the drawings, and to FIGURE 1 in particular, there is shown a schematic diagram of solid state relay apparatus constructed according to this invention. The solid state relay 10 includes input terminals 12 and 14 to which the control voltage is applied, and also includes output terminals 16 and 18 which are connected in a serial fashion to control the current and voltage in a load circuit. Also connected across the output terminals of the solid state relay 10 are a neon glow lamp 20 and a current limiting resistor 22. Of course, other resistor arrangements are equivalent to that shown in FIG. 1, including having separate resistors on each side of the lamp 20. Current limiting resistance is needed because of the negative resistance characteristic exhibited by the lamp 20 after ionization occurs. The glow lamp 20 includes the electrodes 24 and 26 which, depending upon the polarity of the applied voltage across the glow lamp, cause the neon gas adjacent the electrodes to glow.

Typical neon lamps include two non-contacting electrodes which are sealed within an envelope, usually glass, along with a quantity of neon gas. Upon electrical excitation, the neon gas ionizes and glows adjacent to the electrodes. If the lamp is excited by direct current, the gas adjacent to the cathode electrode glows. If the lamp is excited by an alternating current, each electrode alternates as the cathode and, consequently, the glowing moves from electrode to electrode during each cycle of the current. At common powerline frequencies, the persistence of vision makes it appear that both electrodes glow when an AC voltage is across the neon lamp. Thus, a neon lamp appears to have both electrodes glowing when an AC voltage is placed across a lamp, and only one electrode glowing when a DC voltage is applied across the neon lamp.

Figure 2:
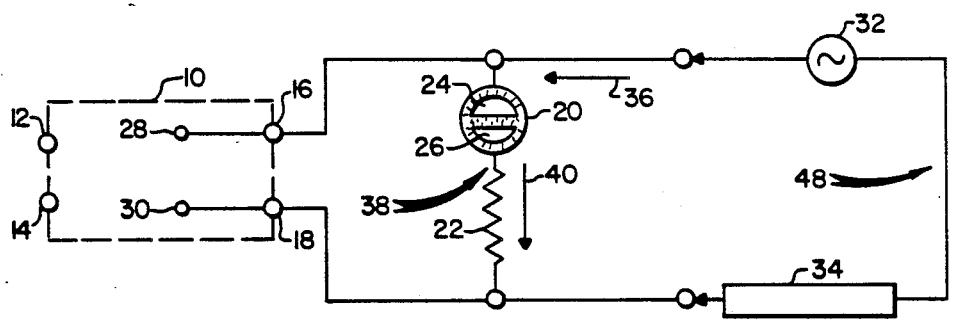
FIG. 2 is a schematic diagram illustrating the operation of the invention according to the OFF relay state.
Figure 3:
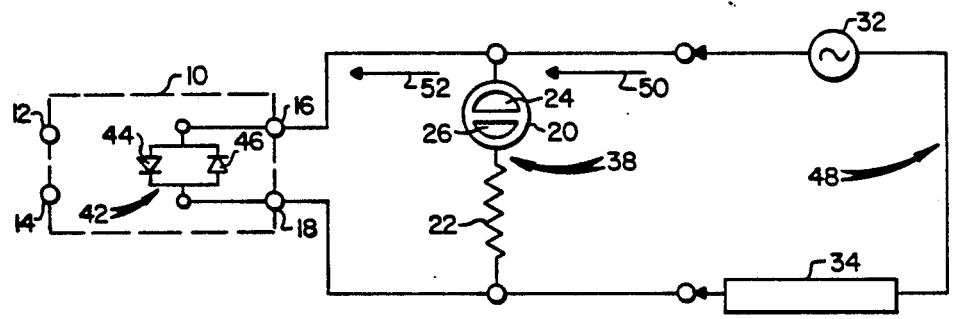
FIG. 3 is a schematic diagram illustrating the operation of the invention according to the ON relay state.
Figures 4, 5:
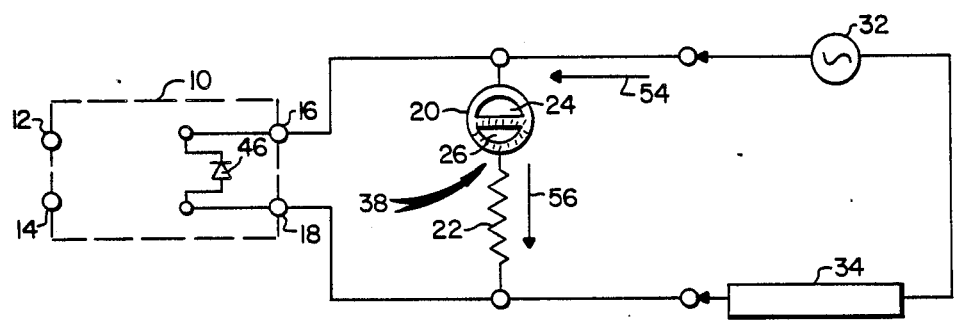
FIG. 4 is a schematic diagram illustrating the operation of the invention according to a half-wave failure mode.
FIG. 5 is a table indicating the relationship between contact mode and electrical glow according to this invention.

FIGS. 2, 3 and 4 will be used herein to illustrate the three "contact" states or modes which can be indicated by the glow lamp according to this invention. It is emphasized that the relay device includes solid state components rather than movable contacts, although the terminology "contacts" is used to define the conducting state of the solid state devices.

According to FIG. 2, the contacts of the solid state relay 10 are in the OFF mode or open circuit condition, as indicated by the absence of a current path between the internal terminals 28 and 30. The load circuit consists of an alternating current power source 32 and the load impedance 34 connected as shown in FIG. 2. Since the contacts of the relay 10 are open circuited, or OFF, the only current flowing (arrow 36) from the load circuit branch 48 of the circuit, flows through the indicator circuit branch 38, as shown by arrow 40. Although the arrows 36 and 40 are shown with one direction, it is to be understood that, with the alternating source 32, the direction of current flow indicated by the arrows 36 and 40 is instantaneous and will change every one-half cycle. Regardless of the polarity of the current through neon lamp 20, both of the electrodes 24 and 26 will appear to glow as indicated in FIG. 2. Even though glowing occurs in the gas adjacent to the electrode having the more negative potential thereon, the quick alternation of the polarities on the electrodes gives the appearance that both electrodes of the neon glow lamp 20 are glowing. Therefore, in the open circuit condition shown in FIG. 2, both electrodes of the lamp 20 glow.

FIG. 3 is a schematic diagram illustrating the operation of the invention according to the ON state of the relay 10. The thyristor 42 is illustrated in FIG. 3 without its control terminals for clarity and is represented here as oppositely connected diodes. TRIAC's and SCR's are also suitable for the solid state switching elements. Element 44 provides current conduction in one direction when properly controlled and element 46 provides current conduction in the other direction when properly controlled. Assuming that the thyristor elememts are properly controlled, the circuit shown in FIG. 3 represents the mode or condition when the relay 10 is conducting or in the ON state. In this mode or "contact" state, current produced from the load branch 48 is entirely conducted by the relay 10, as shown by the arrows 50 and 52. Because of the low impedance of the closed "contacts" of the relay 10, all of the current is shunted around the indicator branch 38. Thus, the lamp 20 does not have sufficient voltage across its electrodes to cause the gas therein to glow. Thus, in this mode of operation, the lamp 20 does not glow at either electrode, thereby indicating that the contacts are ON.

FIG. 4 is a schematic diagram illustrating the operation of the invention according to a half-wave failure mode of the relay 10. This condition occurs when one of the directional switching elements is always conducting regardless of the control voltage applied to terminals 12 and 14 or of the waveform produced by the power source 32. As shown in FIGURE 4, the load current flows with little resistance from terminals 18 to 16 in this failure mode because of the low impedance presented in this direction by the element 46. When the load current is of the polarity shown by arrow 54, the relay 10 appears to be turned OFF because the element 46 does not conduct in the direction of this current and the other switching element (not shown) is not turned ON. Consequently, the current illustrated by arrow 56 through the indicator branch 38 of the circuit substantially equals the current 54.

In this half-wave failure mode, the current flowing through the indicator branch 38 is always of the same polarity even though the source 32 is an AC source. With the polarity of the failure mode as shown in FIG. 4, the electrode 26 of the lamp 20 is the cathode or negative electrode and glows to indicate the half-wave failure mode. It is to be understood that, if the relay 10 failed in a half-wave mode with a thyristor element conducting in the other direction, only the electrode 24 of the lamp 20 would appear to glow. In any event, the appearance of only one electrode glowing for the lamp 20 indicates that the solid state relay 10 has failed in the half-wave mode.

FIG. 5 is a table indicating the relationship between the contact mode and the electrical glow according to the various modes of operation and failure. As can be seen from the table, if the contacts are OFF, both electrodes will glow. On the other hand, if the contacts are ON, neither electrode will glow and, in the half-wave failure mode, only one of the electrodes will glow. It is emphasized that the ON and OFF conditions may be failure modes or modes occurring in normal operation. During trouble shooting and using the visual indicator, the technician can determine whether the state of the relay contacts is consistent with the correct contact state. For example, if during trouble shooting a particular relay in the device is to be ON, and the neon lamp is observed to have neither electrode glowing, it is an indication that the relay is properly functioning in the circuit. On the other hand, if both electrodes of the neon lamp appear to glow, it is an indication that the relay has malfunctioned or failed since its contacts are in the OFF position. As already discussed, a glowing of one of the electrodes indicates that the relay has failed in a half-wave mode.

Although described in conjunction with a source of alternating current and voltage, and for use with a solid state relay capable of switching alternating currents, it is within the contemplation of the invention that the apparatus disclosed herein can be used with solid state relays capable of switching only direct current quantities. When switching direct currents, the information supplied by the glowing electrodes of the neon lamp is somewhat more limited than in the case of AC switching. With DC switching, neither of the electrodes of the neon lamp would glow when the DC solid state relay is in the ON state. However, only one electrode would glow with the contacts in the OFF state or with a contact failure equivalent to a half-wave mode wherein current can only flow in one direction even if the load current was capable of flowing in the other direction.

It is emphasized that a solid state relay may have more than one set of contacts and a neon lamp associated with each set. In addition, the lamp circuitry may be attached directly to the relay or included on a circuit board or terminal connected to the relay output terminals.

There has been disclosed herein new and useful apparatus for providing an economical and convenient indication of the contact status of a solid state relay. The apparatus is especially useful in trouble shooting complicated electrical circuits containing several solid state relays. The indication system is particularly useful with thyristor type solid state relays, although it is also applicable to solid state relays capable of switching only direct currents.

It is emphasized that numerous changes may be made in the above-described apparatus without departing from the teachings of the invention. It is intended that all of the matter contained in the foregoing description, or shown in the accompanying drawings, shall be interpreted as illustrative rather than limiting.

I claim as my invention:

1. Solid state relay apparatus for switching an electrical load between two output terminals, said apparatus comprising:
    relay means for electrically connecting said output terminals together in a first mode of operation and for isolating said output terminals in a second mode of operation; and
    a visual indicator effectively connected in parallel across said output terminals, said indicator including means for visually indicating when a voltage is across the indicator and the polarity of any DC voltage across the indicator.

2. The relay apparatus of claim 1 wherein the relay means is constructed to switch alternating current between a source and a load.

3. The relay apparatus of claim 2 wherein the relay means uses a thyristor type semiconductor device to switch the alternating current.

4. The relay apparatus of claim 1 wherein the visual indicator is a gas glow lamp.

5. The relay apparatus of claim 4 wherein the visual indicator is a neon lamp connected through a current limiting resistance to the output terminals.

6. Relay apparatus for switching alternating currents between two output terminals, said apparatus comprising:
    a thyristor for effectively connecting together said output terminals when the relay apparatus is in an ON state and for effectively isolating said output terminals when the relay apparatus is in an OFF state;
    a two-electrode neon lamp having one of its electrodes connected to one of said output terminals; and
    a current limiting resistor connected between the other electrode of the neon lamp and the other of said output terminals;
    with both of said neon lamp electrodes glowing when the relay is in the OFF state, neither of said electrodes glowing when the relay is in the ON state, and with one of the electrodes glowing if the relay fails in a half-wave mode.

7. Relay apparatus for switching alternating currents between two output terminals, said apparatus comprising:
    relay means for electrically connecting said output terminals together in a first normal mode of operation and for isolating said output terminals in a second normal mode of operation; and
    a light-emitting visual indicator connected to said output terminals, said indicator providing separate indications of the first and second normal modes of operation of the output terminals irrespective of a signal contolling the relay means, and said indicator providing a unique indication of abnormal conduction through the relay of current having only one polarity.

8. The relay apparatus of claim 7 wherein the visual indicator is a two-electrode gas glow lamp whereby both electrodes glow when the relay is in the first normal mode, neither electrode glows when the relay means is in the second normal mode, and only one electrode glows when the relay means is abnormally conducting current having only one polarity.

* * * * *